United States Patent [19]
Kuramitsu

[11] Patent Number: 5,326,277
[45] Date of Patent: Jul. 5, 1994

[54] STRUCTURE FOR MOUNTING PACKAGES WITH ELECTRONIC CIRCUIT COMPONENTS ON A MOUNTING UNIT

[75] Inventor: Masahiko Kuramitsu, Tokyo, Japan

[73] Assignee: NEC Corporation, Tokyo, Japan

[21] Appl. No.: 41,057

[22] Filed: Mar. 31, 1993

[30] Foreign Application Priority Data

Apr. 7, 1992 [JP] Japan .................................. 4-84358

[51] Int. Cl.⁵ .................................. H01R 13/62
[52] U.S. Cl. .................................. 439/327; 439/61; 439/377; 439/188
[58] Field of Search .................... 439/59–62, 439/64, 188, 372, 377, 325, 328; 361/415; 211/41

[56] References Cited

U.S. PATENT DOCUMENTS

| | | | |
|---|---|---|---|
| 3,853,379 | 12/1974 | Goodman et al. | 439/328 |
| 4,017,770 | 4/1977 | Valfre | 439/377 |
| 4,418,971 | 12/1983 | Liss | 439/61 |
| 4,869,680 | 9/1989 | Yamamoto et al. | 439/327 |
| 4,925,397 | 5/1990 | Mirand et al. | 439/328 |
| 5,216,578 | 6/1993 | Zenitami et al. | 439/377 |

Primary Examiner—Larry I. Schwartz
Assistant Examiner—Hien D. Vu
Attorney, Agent, or Firm—Sughrue, Mion, Zinn, Macpeak & Seas

[57] ABSTRACT

A mounting structure includes a mounting unit, a plurality of first connectors arrayed on the mounting unit, a plurality of pairs of guide rails attached to the mounting unit, and a plurality of packages having electronic circuit components mounted thereon. Each of the packages has at least one second connector at one edge thereof which is engaged with at least one of the first connectors when the package is inserted into the mounting unit along an associated pair of the guide rails. The mounting structure further includes a rod and a plurality of arms. A first end of each of the arms is attached to the rod so as to be able to pivot or rotate around the rod. A second end of each of the arms is engaged with an edge of one of the packages opposite to the one edge having the at least one second connector when the arms are pivoted or rotated toward the packages, so that the packages inserted in the mounting unit are prevented from coming out of the mounting unit.

4 Claims, 5 Drawing Sheets

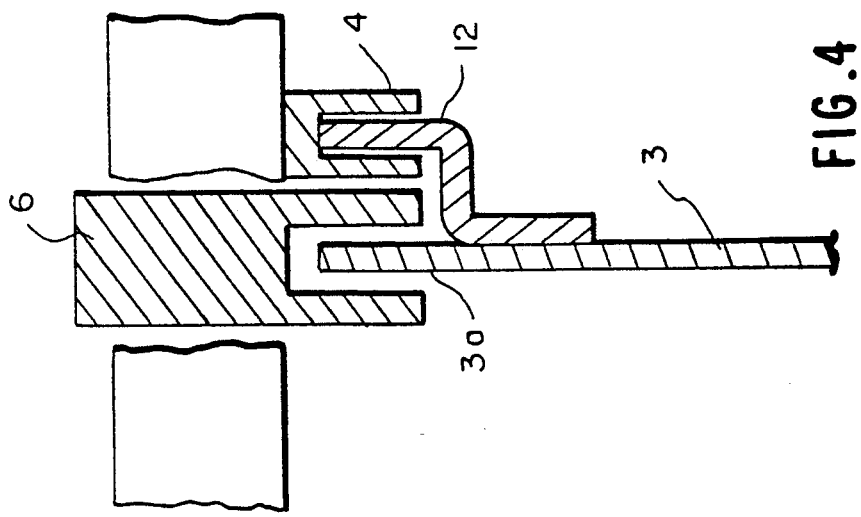
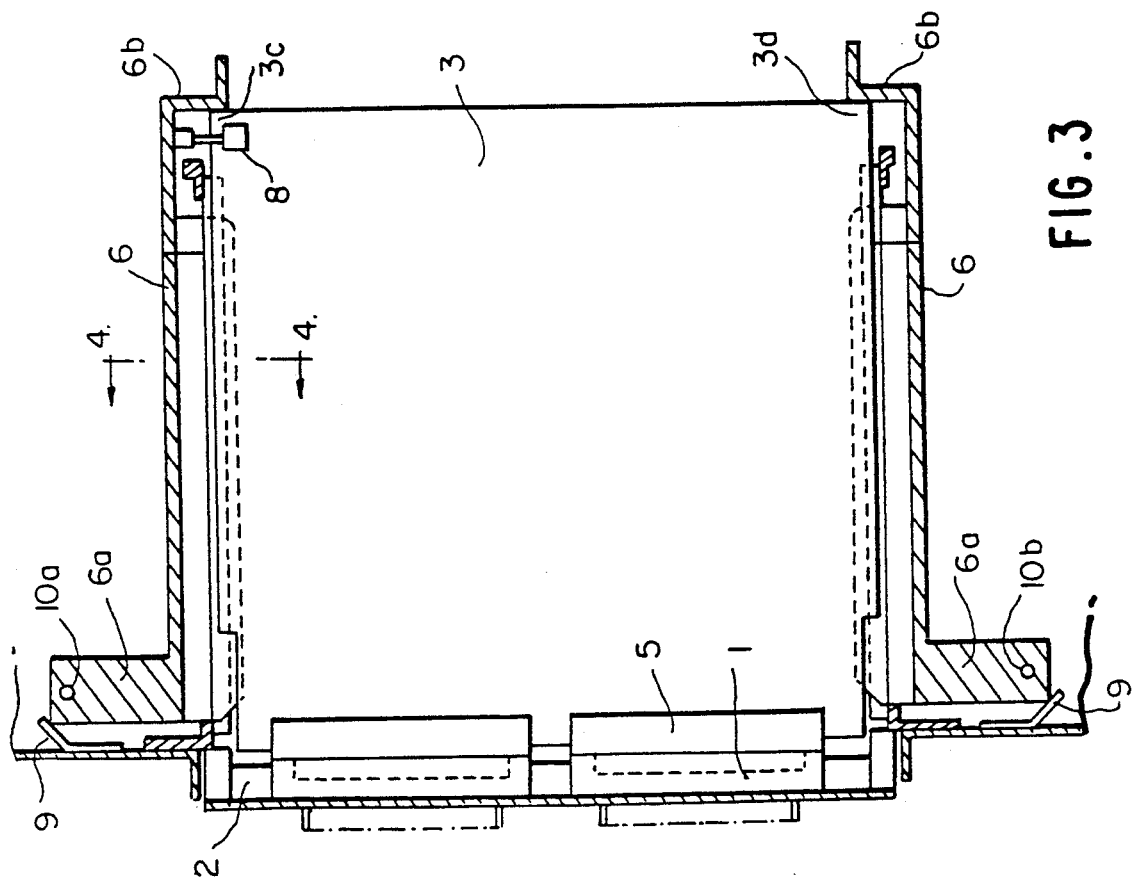

STRUCTURE FOR MOUNTING PACKAGES WITH ELECTRONIC CIRCUIT COMPONENTS ON A MOUNTING UNIT

BACKGROUND OF THE INVENTION

The present invention relates to a structure for mounting packages with electronic circuit components on a mounting unit.

In a conventional structure for mounting packages on a mounting unit, a plurality of pairs of guide. rails are attached to the mounting unit, and each package is inserted into the mounting unit along the associated pair of guide rails so that connectors on the mounting unit are connected to corresponding connectors attached to one edge of each package.

In the conventional structure, there is a disadvantage in that the packages can undesirably come out gradually from the mounting unit due to vibrations generated around the mounting unit. The conventional structure has another disadvantage in that electronic circuit components on each package may be destroyed or those on the other packages may be adversely affected because of surge currents or noises caused when each package is drawn out from the mounting unit. The conventional structure has still another disadvantage in that there is a large voltage drop because electrical power is supplied to each package from the connectors attached to only one edge of the package.

SUMMARY OF THE INVENTION

An object of the invention is therefore to provide a structure for mounting electronic circuit component carrying packages on a mounting unit which does not have the disadvantages of the above-mentioned conventional structure.

According to an aspect of the invention, a mounting structure is provided.

The mounting structure includes a mounting unit, a plurality of first connectors arrayed on the mounting unit, a plurality of pairs of guide rails attached to the mounting unit, and a plurality of packages having electronic circuit components mounted thereon. Each of the packages has at least one second connector at one edge thereof which is engaged with at least one of the first connectors when a corresponding package is inserted into the mounting unit along an associated pair of the guide rails. The mounting structure further includes means for preventing the packages inserted in the mounting unit from coming out of the mounting unit.

Alternatively, first contacts can be provided on edges of each of the packages, and second contacts can be provided on arms pivotally mounted to the mounting unit, so that the second contacts respectively come into contact with the first contacts when the arms are pivoted toward the packages, thereby to supply electrical power to the electrical circuit components of the packages.

BRIEF DESCRIPTION OF THE DRAWINGS

Other features and advantages of the invention will become apparent from the following detailed description when taken in conjunction with the accompanying drawings, in which:

FIG. 3 is a side view of the state after the package 3 is inserted into the mounting unit 2 in the first embodiment;

FIG. 4 is a fragmentary cross-sectional view taken along the lines 4—4 in FIG. 3 and illustrating the relationship between an arm 6, a package 3 and a guide rail 4 in the first embodiment;

In the drawings, the same reference numerals represent the same structural elements.

DETAILED DESCRIPTION OF THE PREFERRED EMBODIMENTS

Description will next be made with respect to a first embodiment of the invention.

Figure 1:
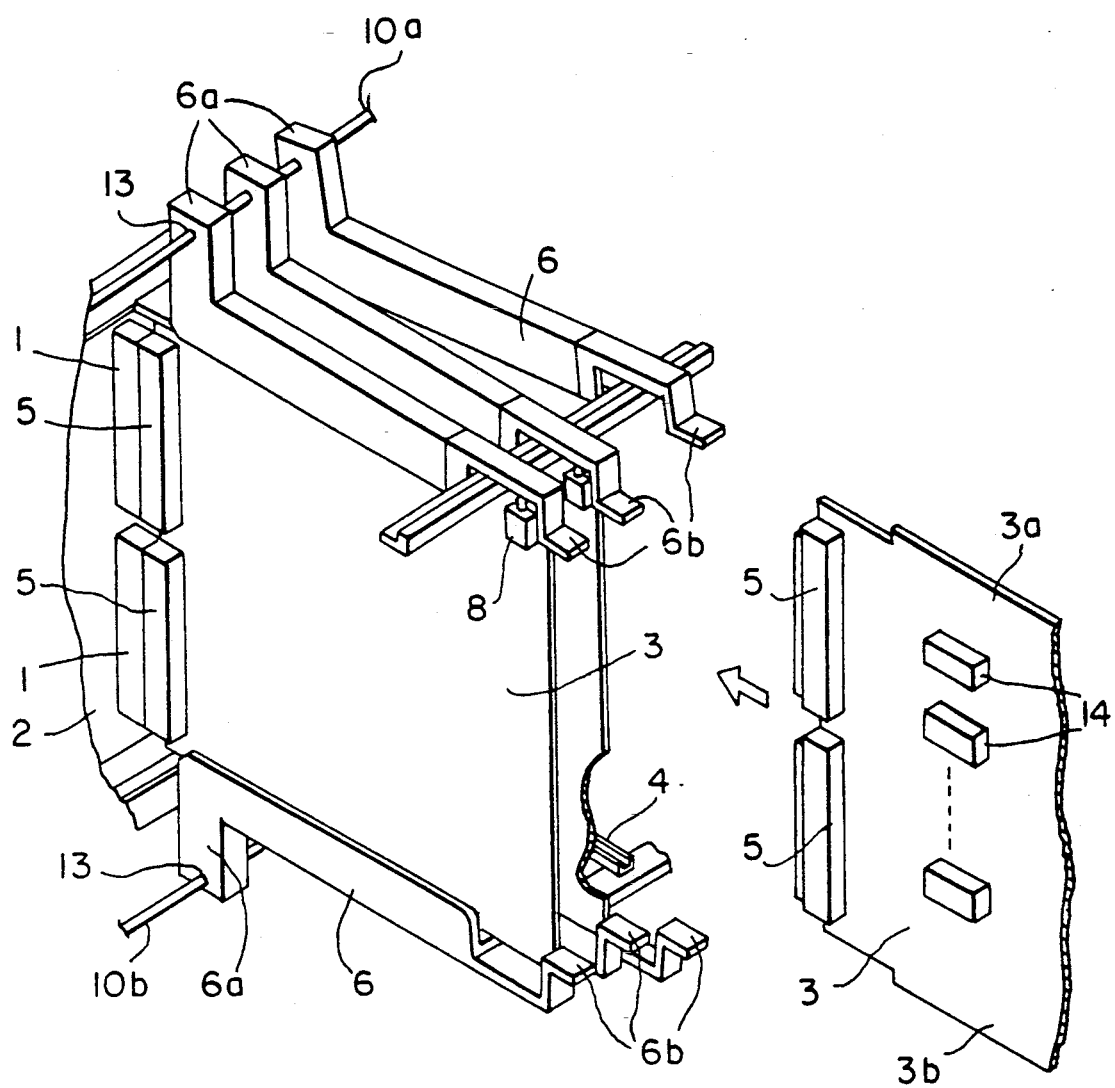
FIG. 1 is a perspective view of a first embodiment of the invention.

Referring to FIG. 1, a first embodiment of the invention includes a mounting unit 2 and a plurality of packages 3. Electronic circuit components 14 are mounted on each of the packages 3. Two male connectors 5 are attached to one edge of each of the packages 3. An array of female connectors 1, for transmitting power and electrical signals to the electronic circuit components 14, and a plurality of pairs of upper and lower guide rails 4 are attached to the mounting unit 2. A plurality of pairs of upper and lower arms 6 are respectively provided adjacent to the pairs of upper and lower guide rails 4. Each arm 6 has a hole 13 adjacent a first end 6a thereof. An upper rod 10a and a lower rod 10b are provided. The upper rod 10a penetrates the holes 13 of the upper arms 6 and the lower rod 10b penetrates the holes 13 of the lower arms 6, thereby to support the arms 6 pivotally or rotatably on the associated rod.

Figure 2:
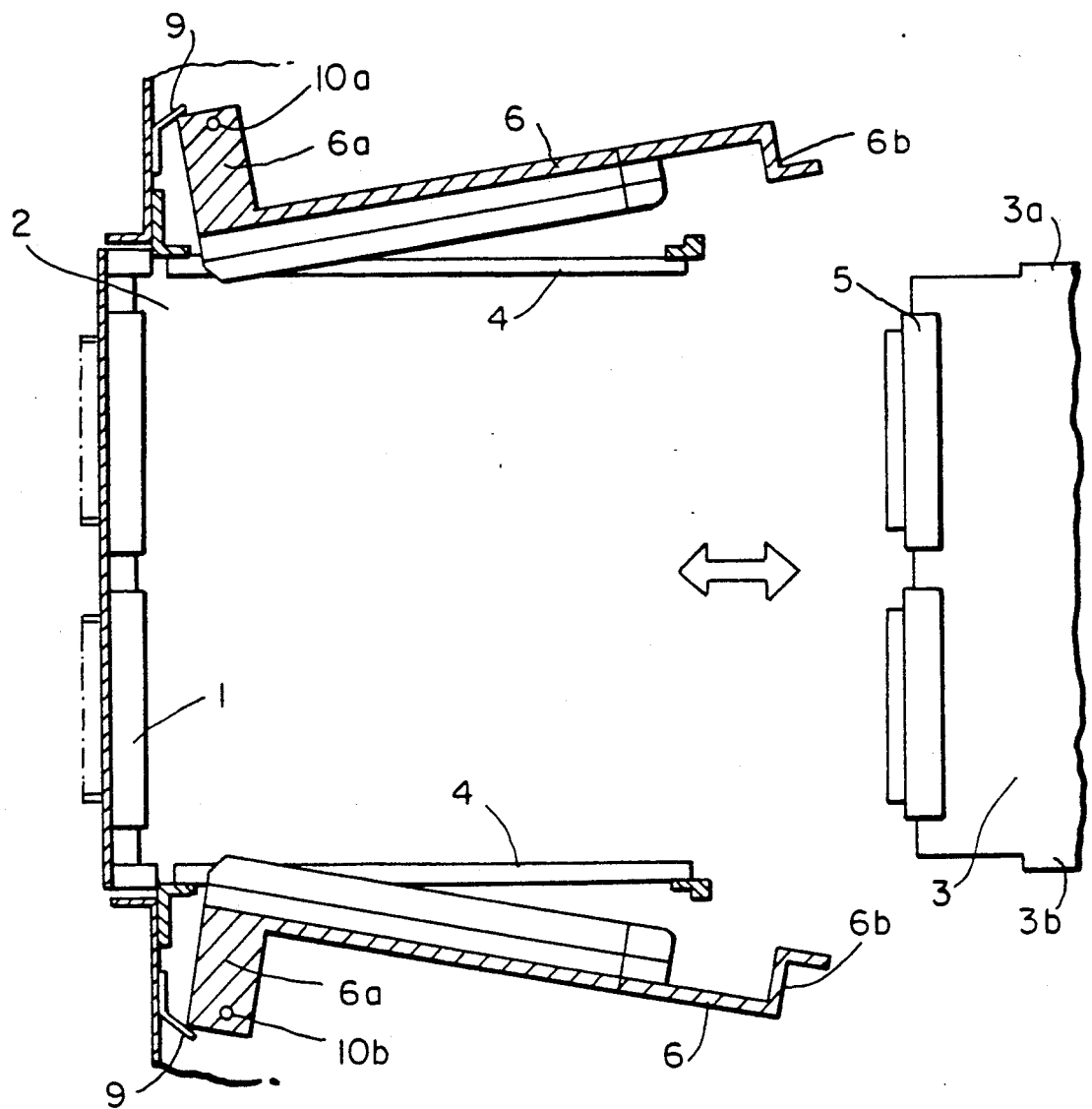
FIG. 2 is a side view of the state before a package 3 is inserted into a mounting unit 2 in the first embodiment.

As shown in FIG. 2, when each package 3 is mounted to the mounting unit 2, a pair of the associated upper and lower arms 6 is pivoted or rotated outwardly with the first ends 6a of the associated arms 6 being pressed against springs 9 fixed to the mounting unit 2. Next, the associated upper and lower guide rails 4 are engaged with guide members 12 attached to opposite edges 3a and 3b of each package 3 (FIG. 4), and each package 3 is inserted into the mounting unit 2 until the male connectors 5 of each package 3 come into contact with the associated female connectors 1 on the mounting unit 2. Then, the associated upper and lower arms 6 are pivoted inwardly so that the opposite edges 3a and 3b of each package 3 become engaged with the associated arms 6 (FIGS. 3 and 4). At that state, second ends 6b of the arms 6, which are shaped in the form of the letter "L" are engaged with two corners 3c and 3d of each package 3 so that the package is prevented from coming out of the mounting unit 2.

A switch 8 is provided at the corner 3c of each package 3. When the associated arm 6 is pivoted inwardly, the switch 8 is pushed down by a portion of the arm 6 which is adjacent to the second end 6b. While the switch 8 is down, the electronic circuit components 14 on the associated package 3 are kept active. On the other hand, when each package 3 is drawn out from the mounting unit 2, the associated switch 8 is turned off because the associated arm 6 is pivoted outwardly thereby releasing switch 8 as the portion of the arm 6 adjacent to the second end 6b no longer pushes down switch 8. As a result, the electronic circuit components 14 on the associated package 3 turn inactive. Therefore, the switch 8 functions as a means for keeping the electronic circuit components active only when the packages are inserted in the mounting unit.

Figure 5:
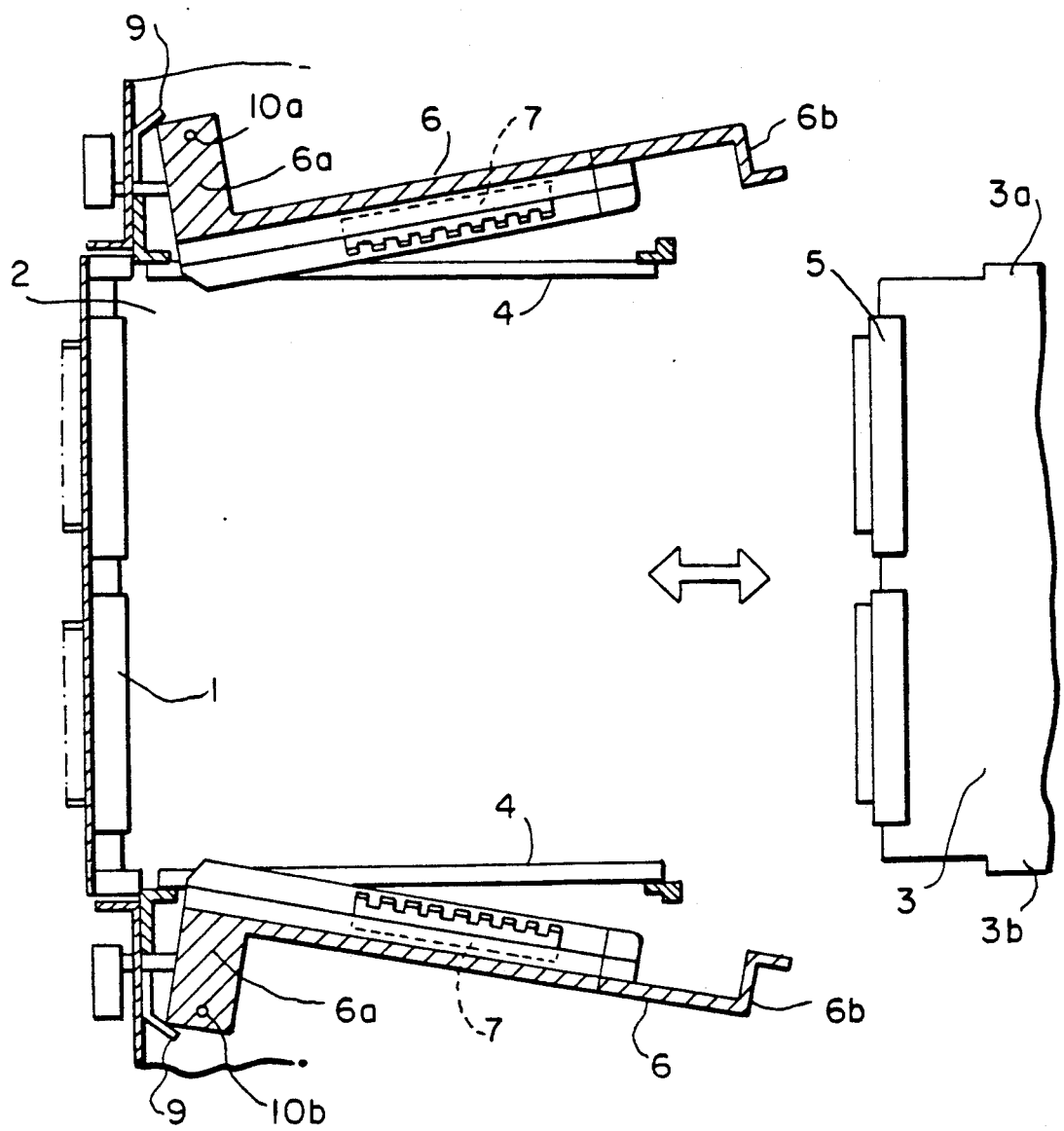
FIG. 5 is a side view of the state before a package 3 is inserted into a mounting unit 2 in a second embodiment of the invention.
Figure 7:
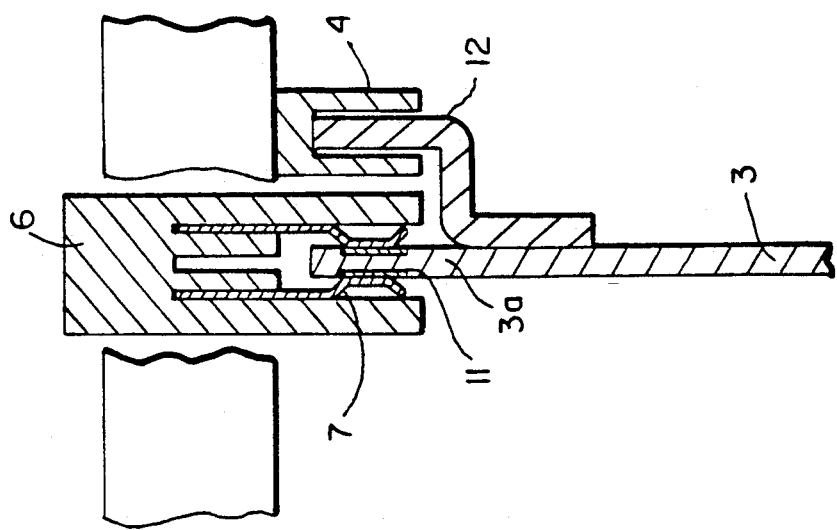
FIG. 7 is a fragmentary cross-sectional view taken along the lines 7—7 in FIG. 6 and illustrating the relationship between an arm 6, a package 3 and a guide rail 4 in the second embodiment.
Figure 6:
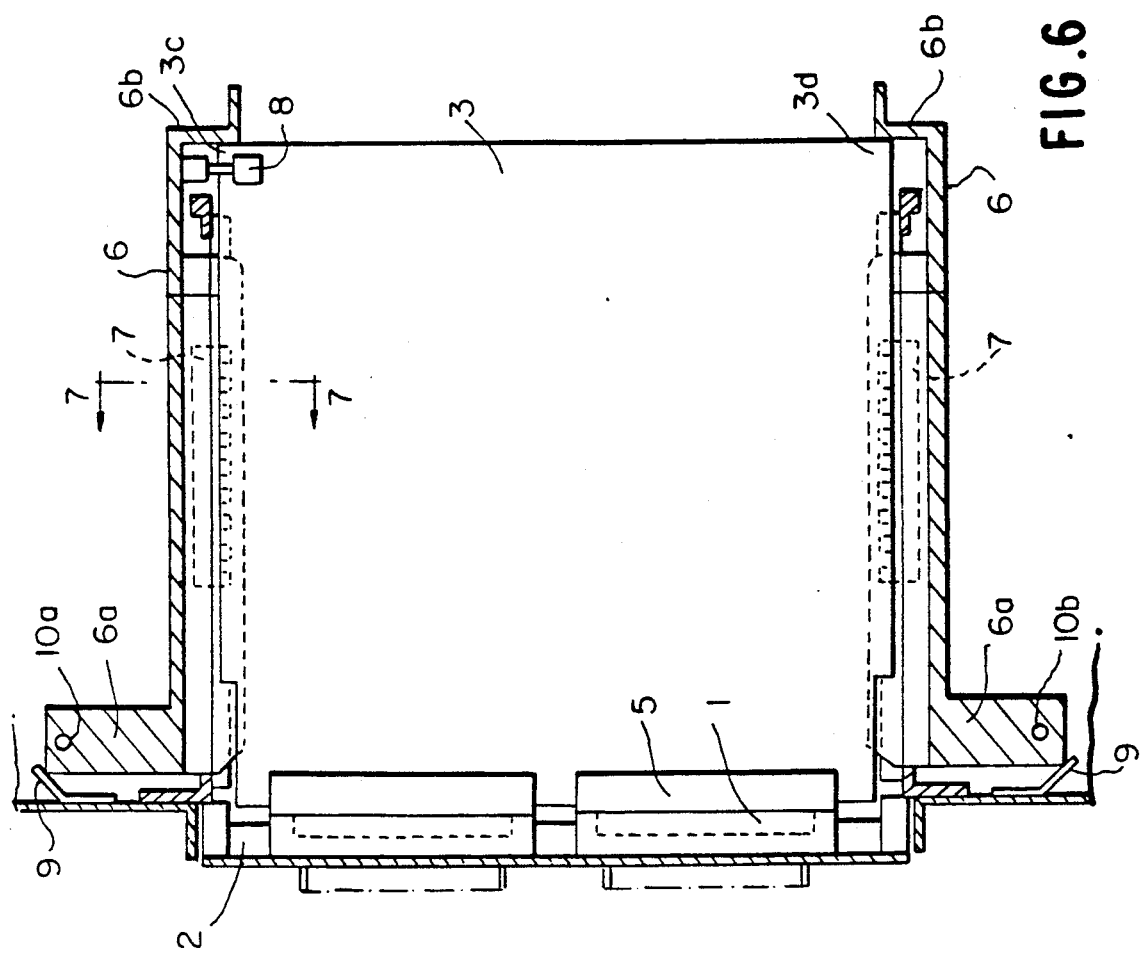
FIG. 6 is a side view of the state after the package 3 is inserted into the mounting unit 2 in the second embodiment.

Referring to FIGS. 5 to 7, a second embodiment of the invention has basically the same structure as the first embodiment. In the second embodiment, each of the arms 6 has a comb-like contact 7. After each package 3 is inserted into the mounting unit 2 along the associated guide rails 4, contacts 11 (FIG. 7) provided on opposite edges 3a and 3b of each package 3 come into contact with the contacts 7 of the associated arms 6 when the associated arms 6 are pivoted inwardly. The contacts 7 are connected to a power supply source (not shown). The electronic circuit components on the packages 3 are supplied with electrical power from the power supply source via the contacts 7 and 11.

Although the present invention has been fully described by way of the preferred embodiments thereof with reference to the accompanying drawings, various changes and modifications will be apparent to those having skill in this field. Therefore, unless these changes and modifications otherwise depart from the scope of the present invention, they should be construed as included therein.

What is claimed is:

1. A mounting structure comprising:
a mounting unit;
first connector attached to said mounting unit;
a pairs of guide rails attached to said mounting unit;
a package having electronic circuit components disposed thereon, said package having at least one second connector at one edge thereof which is engaged with said first connector when inserted into said mounting unit along said air of guide rails;
a rod;
a pair of arms each having first and second ends, said first end of each of said arms being supported on said rod so as to be able to pivot around said rod, said second end of each of said arms being engaged with an edge of said package when said package are mounted to said mounting unit and said arms are pivoted toward said package; and
a switch provided on said package, said switch being depressed by at least one of said arms when said arms are pivoted toward said package, thereby activating said electronic circuit components of said package and said switch being released when said arms are pivoted away from said package, thereby deactivating said electronic components of said package.

2. A mounting structure comprising:
a mounting unit;
first connector attached to said mounting unit;
a pair of guide rails attached to said mounting unit;
a package having electronic circuit components disposed thereon, said package having at least one second connector at one edge thereof which is engaged with said first connector when inserted into said mounting unit along said pair of guide rails;
a rod;
a pair of arms each having first and second ends, said first end of each of said arms being supported on said rod so as to be able to pivot around said rod, said second end of each of said arms being engaged with an edge of said package when said package are mounted to said mounting unit and said arms are pivoted toward said package; and
first contacts provided on opposite edges of said package, said first contacts of said package being disposed adjacent to said one edge having said at least one second connector; and
second contacts provided on said arms, said second contacts being connected to a power supply source, said second contacts respectively coming into contact with said first contacts when said arms are pivoted toward said package, thereby supplying electric power from said power supply source via said first contacts and said second contacts to said electronic components on said package, said electronic components being isolated from said power supply source when said arms are pivoted away from said package, removing said second contacts from contact with said first contacts.

3. The mounting structure as claimed in claim 2, wherein each of said second contacts comprises a comb-like contact.

4. The mounting structure as claimed in claim 2, wherein said first contacts and said second contacts can be larger than conventional pin-type contacts.

* * * * *